(12) United States Patent
Su

(10) Patent No.: US 11,043,544 B2
(45) Date of Patent: Jun. 22, 2021

(54) ORGANIC LIGHT EMITTING DIODE DISPLAY MODULE, MANUFACTURING METHOD THEREOF AND ELECTRONIC DEVICE

(71) Applicant: SHENZHEN ROYOLE TECHNOLOGIES CO., LTD., Guangdong (CN)

(72) Inventor: Weisheng Su, Guangdong (CN)

(73) Assignee: SHENZHEN ROYOLE TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/764,671

(22) PCT Filed: Nov. 17, 2017

(86) PCT No.: PCT/CN2017/111692
§ 371 (c)(1),
(2) Date: May 15, 2020

(87) PCT Pub. No.: WO2019/095297
PCT Pub. Date: May 23, 2019

(65) Prior Publication Data
US 2020/0403046 A1 Dec. 24, 2020

(51) Int. Cl.
*H01L 27/32* (2006.01)
*H01L 51/52* (2006.01)
(Continued)

(52) U.S. Cl.
CPC ........ *H01L 27/3246* (2013.01); *G06F 3/0412* (2013.01); *G06F 3/04166* (2019.05);
(Continued)

(58) Field of Classification Search
CPC ............. H01L 27/3246; H01L 27/3276; H01L 27/323; H01L 51/5225; H01L 51/56; G06F 3/04166; G06F 3/0412
See application file for complete search history.

(56) References Cited

U.S. PATENT DOCUMENTS 9,583,551 B2 * 2/2017 Zhang ............... H01L 27/3279
10,088,930 B2 * 10/2018 Huo ...................... G06F 3/0446

FOREIGN PATENT DOCUMENTS

| CN | 105552106 A | 5/2016 |
| CN | 105789262 A | 7/2016 |
| CN | 106251782 A | 12/2016 |

OTHER PUBLICATIONS

International Search Report issued in corresponding International Application No. PCT/CN2017/111692, dated Aug. 23, 2018, pp. 1-4, State Intellectual Property Office of the P.R. China, Beijing, China.

* cited by examiner

*Primary Examiner* — Sardis F Azongha
(74) *Attorney, Agent, or Firm* — Hauptman Ham, LLP

(57) ABSTRACT

Organic light emitting diode display module includes a substrate, a flat layer formed on the substrate, an anode layer formed on the flat layer and within the second through hole, a pixel definition layer formed on the flat layer and the anode layer, a light-emitting layer and a cathode layer formed within third layer through hole and on anode layer. A lead and a power cable are formed on the substrate. The cathode layer is formed on the pixel definition layer, light-emitting layer and lead. The cathode layer includes wire blocks arranged at intervals. The wire blocks includes a bent conductive wire, and both ends of the conductive wire are coupled to the lead and the power cable respectively. The
(Continued)

present disclosure also discloses a manufacturing method of the display module and an electronic device.

9 Claims, 11 Drawing Sheets

(51) Int. Cl.
  *H01L 51/56* (2006.01)
  *G06F 3/041* (2006.01)
  *G09G 3/3225* (2016.01)
(52) U.S. Cl.
  CPC .......... *G09G 3/3225* (2013.01); *H01L 27/323* (2013.01); *H01L 51/5225* (2013.01); *H01L 51/56* (2013.01); *G06F 2203/04103* (2013.01); *H01L 2227/323* (2013.01)

ORGANIC LIGHT EMITTING DIODE DISPLAY MODULE, MANUFACTURING METHOD THEREOF AND ELECTRONIC DEVICE

RELATED APPLICATION

The present application is a U.S. National Phase of International Application Number PCT/CN2017/111692, filed Nov. 17, 2017.

TECHNICAL FIELD

The present disclosure relates to a field of display technology, in particular, to an organic light emitting diode display module, a manufacturing method thereof and an electronic device.

BACKGROUND

The existing flexible organic light emitting diode display module includes an anode, a light-emitting layer, and a cathode. The cathode is in an overall layer shape so as to control the anode and cathode to apply a voltage to the light-emitting layer. When the display module is bent, the optical characteristics of the display module at a bending position are significantly worse. The existing display module cannot obtain a curvature radius of each bending position on the display module according to the cathode, so the display module cannot perform appropriate display compensation for each bending position of the display module.

SUMMARY

Embodiments of the present disclosure provide an organic light emitting diode display module, a manufacturing method of the organic light emitting diode display module, and an electronic device.

An organic light emitting diode display module according to one embodiment of the present disclosure, the display module includes a substrate, a flat layer, an anode layer, a pixel definition layer, a light-emitting layer, and a cathode layer.

The substrate has a lead and a power cable formed on the substrate.

The flat layer is formed on the substrate. The flat layer defines a first through hole and a second through hole, and a part of the lead corresponds to a position of the first through hole.

The anode layer is formed on the flat layer and within the second through hole.

The pixel definition layer is formed on the flat layer and the anode layer; the pixel definition layer defines a third through hole and a fourth through hole; a part of the anode layer corresponds to a position of the third through hole; the fourth through hole interconnects with the first through hole.

The light-emitting layer is formed within the third through hole and on the anode layer.

The cathode layer is formed on the pixel definition layer, the light-emitting layer; and the lead; the cathode layer includes a plurality of wire blocks arranged at intervals; and each wire block includes a bent conductive wire; one end of each conductive wire is coupled to the lead, and the other end of each conductive wire is coupled to the power cable.

The organic light emitting diode display module of the embodiment of the present disclosure can divide the cathode layer into a plurality of conductive wires and determine a curvature radius of a position of the display module according to the curvature radius of each conductive wire, so that the display module can perform display compensation on the display module according to the curvature radius of each conductive wire.

An electronic device of the embodiments of the present disclosure includes the display module described in the above embodiment, an ammeter, a processor and a memory unit.

The ammeter is coupled to the conductive wire through the lead, and configured to detect a current flowing through the conductive wire.

The processor is configured for calculating a deformation of each conductive wire according to a length of the conductive wire, a Poisson's ratio of the conductive wire, a resistivity of the conductive wire, a current, and a voltage provided by the power cable.

The memory unit stores a plurality of deformation values of the conductive wire and a plurality of curvature radius values corresponding to the plurality of deformation values. The processor calculates the curvature radius of the conductive wire according to the deformation of each conductive wire and the plurality of curvature radius values stored in the memory unit.

The organic light emitting diode display module of the embodiment of the present disclosure can divide the cathode layer into the plurality of conductive wires, which facilitates obtaining the current flowing through the conductive wire by using the ammeter. In this way; the processor can calculate the deformation of each conductive wire, and then calculates the curvature radius of the conductive wire according to the deformation of each conductive wire and the plurality of curvature radius values stored in the memory unit.

The manufacturing method of the organic light emitting diode display module according to the embodiment of the present disclosure includes following steps.

A substrate is provided with a lead and a power cable formed on the substrate;

A flat layer is formed on the substrate; the flat layer defines a first through hole and a second through hole, and a part of the lead corresponds to a position of the first through hole;

An anode layer is formed on the flat layer and within the second through hole;

A pixel definition layer is formed on the flat layer and the anode layer; the pixel definition layer defines a third through hole and a fourth through hole, and a part of the anode layer corresponds to a position of the third through hole, the fourth through hole interconnects with the first through hole.

A light-emitting layer is formed within the third through hole and on the anode layer.

A cathode layer is formed on the pixel definition layer, the light-emitting layer, and the lead; the cathode layer includes a plurality of wire blocks arranged at intervals, and each wire block includes a bent conductive wire; one end of each conductive wire is coupled to the lead, and the other end of each conductive wire is coupled to the power cable.

The organic light emitting diode display module manufactured by the manufacturing method of the organic light emitting diode display module according to the embodiment of the present disclosure can divide the cathode layer into a plurality of conductive wires, and determine a curvature radius of a position of the display module according to the curvature radius of each conductive wire, so that the display module can perform display compensation on the display module according to the curvature radius of each conductive wire.

Additional aspects and advantages of the embodiments of the present disclosure will be partially given in the following description, and some will become apparent from the following description, or be learned through practice of the embodiments of the present disclosure.

BRIEF DESCRIPTION OF THE ACCOMPANYING DRAWINGS

The above and/or additional aspects and advantages of the present disclosure will become apparent and easily understood from the description of the embodiments with reference to the following drawings, in which.

DETAILED DESCRIPTION OF ILLUSTRATED EMBODIMENTS

Figure 1:
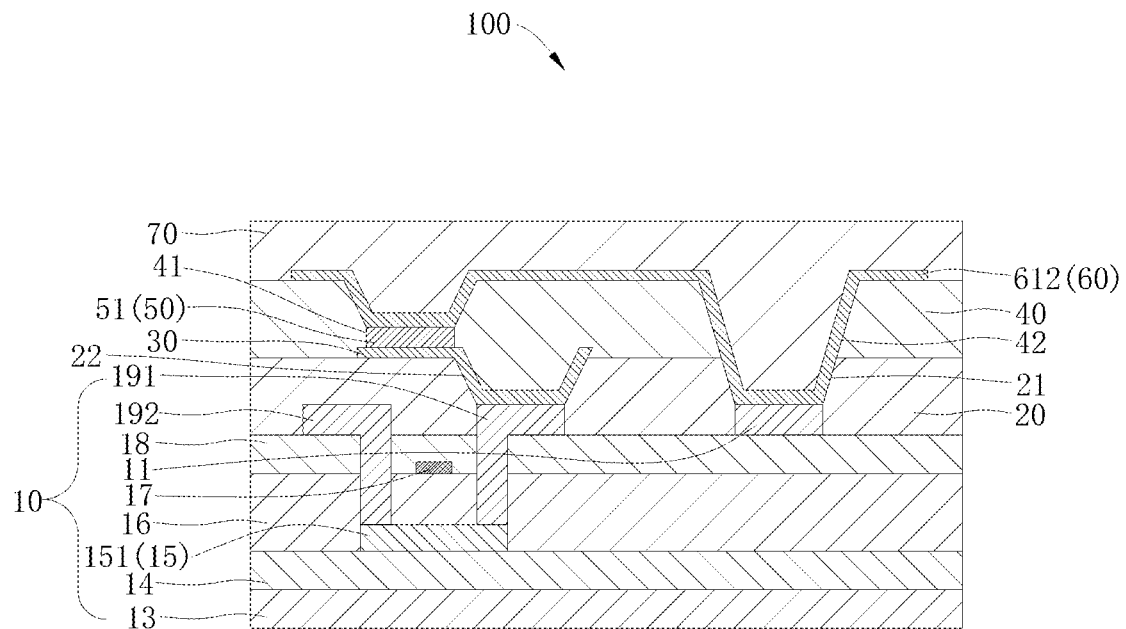
FIG. 1 is a cross-sectional view of a display module according to some embodiments of the present disclosure.

The embodiments of the present disclosure are described in detail below, and examples of the embodiments are shown in the drawings, in which the same or similar reference numerals indicate the same or similar elements or elements having the same or similar functions throughout. The embodiments described below with reference to the drawings are exemplary, and are only used to explain the present disclosure, and cannot be construed as limiting the present disclosure.

In the description of the present disclosure, it should be understood that the orientation or positional relationship indicated by the terms "center", "longitudinal", "transverse", "length", "width", "thickness", "upper", "lower", "front", "back", "left", "right", "vertical", "horizontal", "top", "bottom", "inner", "outer", "clockwise", "counter-clockwise" is based on the orientation or positional relationship shown in the drawings, and is only for the convenience of describing the present disclosure and simplifying the description, rather than indicating or implying that the device or element must have a specific orientation, be constructed and operated in a specific orientation, therefore, it cannot be understood as a limitation to the present disclosure. In addition, the terms "first" and "second" are used for description purposes only, and cannot be understood as indicating or implying relative importance or implicitly indicating the number of technical features indicated. Thus, the features defined as "first" and "second" may explicitly or implicitly include one or more features. In the description of the present disclosure, the meaning of "plurality" is two or more, unless otherwise specifically limited.

In the description of the present disclosure, it should be noted that, unless otherwise clearly specified and defined, the terms "installation", "interconnection", and "connection" should be understood in a broad sense, for example, it can be fixedly connected or detachably connected, or integrally connected; it can be mechanically connected, electrically connected, or can communicate with each other; it can be directly connected, or it can be indirectly connected through an intermediary, it can be the connection between two elements or the interaction between two elements. Those of ordinary skill in the art can understand the specific meanings of the above terms in the present disclosure according to specific situations.

In the present disclosure, unless otherwise clearly specified and defined, the first feature "above" or "below" the second feature may include the first and second features in direct contact, or may include the first and second features not directly contact but through other features between them. Moreover, the first feature is "on", "above" and "upper" the second feature includes that the first feature is directly above and obliquely above the second feature, or simply means that the horizontal height of the first feature is higher than the second feature. The first feature is "under", "below" and "lower" the second feature includes that the first feature is directly below and obliquely below the second feature, or simply means that the horizontal height of the first feature is less than the second feature.

The following disclosure provides many different embodiments or examples for implementing different structures of the present disclosure. In order to simplify the disclosure of the present disclosure, the components and settings of specific examples are described below. Of course, they are only examples, and the purpose is not to limit the present disclosure. In addition, the present disclosure may repeat reference numerals and/or reference letters in different examples. Such repetition is for the purpose of simplicity and clarity, and does not itself indicate the relationship between the various embodiments and/or settings discussed. In addition, the present disclosure provides examples of various specific processes and materials, but those of ordinary skill in the art may be aware of the application of other processes and/or the use of other materials.

Figure 2:
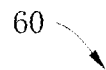
FIG. 2 is a schematic plan view of a cathode layer according to some embodiments of the present disclosure.
Figure 3:
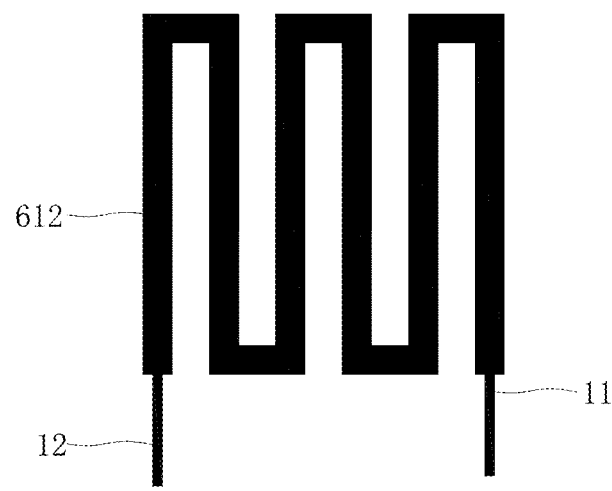
FIG. 3 is a schematic plan view of a conductive wire coupled to a power cable and a lead according to some embodiments of the present disclosure.

Referring to FIGS. 1-3, the organic light emitting diode display module 100 according to one embodiment of the present disclosure includes a substrate 10, a flat layer 20, an anode layer 30, a pixel definition layer 40, a light-emitting layer 50, and a cathode layer 60. A lead 11 and a power cable 12 are formed on the substrate 10. The flat layer 20 is formed on the substrate 10. The flat layer 20 defines a first through hole 21 and a second through hole 22, and a part of the lead 11 corresponds to a position of the first through hole 21. The anode layer 30 is formed on the flat layer 20 and within the second through hole 22. The pixel definition layer 40 is formed on the flat layer 20 and the anode layer 30. The pixel definition layer 40 defines a third through hole 41 and a fourth through hole 42, a part of the anode layer 30 corresponds to a position of the third through hole 41, and the fourth through hole 42 is interconnected with the first through hole 21. The light-emitting layer 50 is formed within the third through hole 41 and formed on the anode layer 30. The cathode layer 60 is formed on the pixel definition layer 40, the light-emitting layer 50, and lead 11. The cathode layer 60 includes a plurality of wire blocks 61 arranged at intervals. Each wire block 61 includes a bent conductive wire 612, and one end of each conductive wire 612 is coupled to the lead 11, and the other end of the conductive wire 612 is coupled to the power cable 12.

Specifically, the lead 11 may be completely exposed on the substrate 10 (as shown in FIG. 1); or, a part of the lead 11 may be exposed outside the substrate 10 (for example, when the lead 11 and the gate layer 17 are on the same layer). One end of the lead 11 is electrically coupled to one end of conductive wire 612, and the other end of the lead 11 may be electrically coupled to other electronic components (for example, a circuit board) or may not be electrically coupled to any electronic component. The light-emitting layer 50 includes a plurality of light units 51 arranged at intervals, and each light unit 51 corresponds to a pixel unit of the display module 100. Each wire block 61 may correspond to a plurality of light units 51, and the conductive wire 612 in each wire block 61 is electrically coupled to the corresponding plurality of light units 51; alternatively, each wire block 61 may also correspond to one light unit 51, the conductive wire 612 in each wire block 61 is electrically coupled to one corresponding light unit 51. One end of the power cable 12 is electrically coupled to the conductive wire 612, and the other end of the power cable 12 is electrically coupled to a power supply outside the display module 100 to supply power to the conductive wire 612 through the power cable 12.

The organic light emitting diode display module 100 of the embodiments of the present disclosure divides the cathode layer 60 into a plurality of conductive wires 612, therefore, a curvature radius of a position of the display module 100 can be determined according to the curvature radius of each conductive wire 612, so that the display module 100 can perform display compensation for the display module 100 according to the curvature radius of each conductive wire 612.

Referring to FIG. 1, an organic light emitting diode display module 100 according to one embodiment of the present disclosure includes a substrate 10, a flat layer 20, an anode layer 30, a pixel definition layer 40, a light-emitting layer 50, and a cathode layer 60.

The substrate 10 includes a lead 11, a power cable 12, a substrate layer 13, a buffer layer 14, a semiconductor layer 15, a first insulating layer 16, a gate layer 17, a second insulating layer 18, a drain 191, and a source 192. The buffer layer 14 is formed on the substrate layer 13. The semiconductor layer 15 is formed on the buffer layer 14. The first insulating layer 16 is formed on the buffer layer 14 and the semiconductor layer 15. The gate layer 17 is formed on the first insulating layer 16. The second insulating layer 18 is formed on the gate layer 17 and the first insulating layer 16. The semiconductor layer 15 includes a plurality of semiconductor units 151 arranged at intervals. The drain 191 is formed on one side of the second insulating layer 18 away from the first insulating layer 16, passes through the second insulating layer 18 and the first insulating layer 16, and is then electrically coupled to one end of the semiconductor unit 151. The source 192 is formed on one side of the second insulating layer 18 away from the first insulating layer 16, and passes through the second insulating layer 18 and the first insulating layer 16 and is then electrically coupled to the other end of the semiconductor unit 151. The semiconductor unit 151, the drain 191, the source 192 and the gate layer 17 together constitute a thin film transistor. The lead 11 may be formed on one side of the second insulating layer 18 away from the first insulating layer 16. The power cable 12 may be formed on one side of the second insulating layer 18 away from the first insulating layer 16. The substrate layer 13 may have a circular, elliptical, rectangular, triangular, pentagonal, hexagonal or arbitrary polygonal sheet structure. The material of the substrate layer 13 may include glass or polyimide (PI). The material of the buffer layer 14 may include copper phthalocyanine (CuPc). The material of the first insulating layer 16 may include silicon dioxide (SiO2). The material of the second insulating layer 18 may include silicon dioxide (SiO2).

The flat layer 20 is formed on the substrate 10, and specifically, the flat layer 20 is formed on the drain 191, the source 192, the lead 11, and the second insulating layer 18. The flat layer 20 defines a first through hole 21 and a second through hole 22. The first through hole 21 corresponds to the position of the lead 11 so that the part of the lead 11 is located within the first through hole 21. The second through hole 22 corresponds to the position of the drain 191 so that the part of the drain 191 is located within the second through hole 22. When the anode layer 30 is not formed on the flat layer 20 and within the second through hole 22, the part of the drain 191 is exposed from the second through hole 22. When the pixel definition layer 40 and the cathode layer 60 are not formed on the lead 11, one part of the lead 11 is exposed from the flat layer 20. The material of the flat layer 20 may include photoresist.

The anode layer 30 is formed on the flat layer 20 and within the second through hole 22. One part of the anode layer 30 is located within the second through hole 22 and is electrically coupled to the drain 191.

The pixel definition layer 40 is formed on the flat layer 20 and the anode layer 30. The pixel definition layer 40 defines a third through hole 41 and a fourth through hole 42. A part of the anode layer 30 corresponds to a position of third through hole 41 so that the part of anode layer 30 is located within third through hole 41. When the light-emitting layer 50 is not formed on pixel definition layer 40, the part of the anode layer 30 is exposed from the third through hole 41. The fourth through hole 42 is interconnected with the first through hole 21 correspondingly, when the pixel definition layer 40 is not formed on the cathode layer 60, a part of the lead 11 is exposed from the flat layer 20. The material of the pixel definition layer 40 may include photoresist.

The light-emitting layer 50 is formed within the third through hole 41 and on the anode layer 30. The light-emitting layer 50 includes a plurality of light units 51, and each light unit 51 is electrically coupled to a corresponding drain 191 through the anode layer 30. Each light unit 51 corresponds to a pixel unit of the display module 100.

Referring to FIGS. 1-3, the cathode layer 60 is formed on the pixel definition layer 40, the light-emitting layer 50, and the lead 11. The cathode layer 60 includes a plurality of wire blocks 61 arranged at intervals, and each wire block 61 includes a bent conductive wire 612, one end of each conductive wire 612 is coupled to the lead 11, and the other end of each conductive wire 612 passes through the pixel definition layer 40 and the flat layer 20, and is then coupled to the power cable 12. The wire blocks 61 are distributed in an array on the pixel definition layer 40, the light-emitting layer 50 and the lead 11. Each wire block 61 may also correspond to one light unit 51, and the conductive wire 612 in each wire block 61 is electrically coupled to a corresponding light unit 51. The material of the conductive wire 612 may be any one of magnesium (Mg), magnesium silver alloy (MgAg), and magnesium ytterbium alloy (YbMg).

The organic light emitting diode display module 100 of the embodiment of the present disclosure divides the cathode layer 60 into a plurality of conductive wires 612, therefore, a curvature radius of a position of the display module 100 can be determined according to the curvature radius of each conductive wire 612, so that the display module 100 can perform display compensation for the display module 100 according to the curvature radius of each conductive wire 612.

The organic light emitting diode display module 100 of the embodiment of the present disclosure also has the following beneficial effects: first, the lead 11 is formed on one side of the second insulating layer 18 away from the first insulating layer 16, so that no additional substrate is required for manufacturing the lead 11 and thus the display module 100 having a thinner thickness is facilitated.

Second, the conductive wire 612 in each wire block 61 is electrically coupled to a corresponding light unit 51, so that each conductive wire 612 can provide a voltage to the corresponding light unit 51.

In some embodiments, the lead 11 of the above embodiment is formed on the first insulating layer 16, and the lead 11 and the gate layer 17 are on the same layer. The second insulating layer 18 defines a fifth through hole (not shown) corresponding to both the first through hole 21 and the fourth through hole 42. One part of the lead 11 corresponds to a position of the fifth through hole so that the part of the lead 11 is located in the fifth through hole. The lead 11 can be exposed from the fifth through hole and the first through hole 21. The lead 11 is formed on one side of the first insulating layer 16 away from the buffer layer 14, so that no additional substrate is required for manufacturing the lead 11, thereby facilitating the manufacture of the display module 100 with a thinner thickness.

Please referring to FIG. 1, in some embodiments, the display module 100 further includes an encapsulation layer 70 formed on the pixel definition layer 40 and the cathode layer 60 and covering the pixel definition layer 40 and the cathode layer 60. The encapsulation layer 70 is used to isolate the cathode layer 60 from contacting with water vapor and oxygen to avoid the chemical reaction of the cathode layer 60 with water vapor and oxygen, resulting in the failure of the cathode layer 60.

Figure 4:
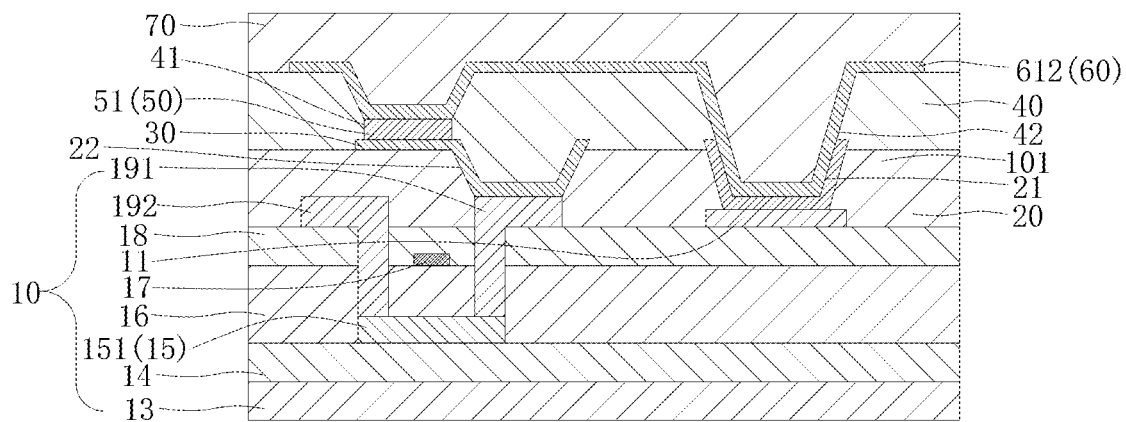
FIG. 4 is a cross-sectional view of a display module according to some embodiments of the present disclosure.

Please referring to FIG. 4, in some embodiments, the display module 100 further includes a conductive layer 101. The conductive layer 101 is formed in the first through hole 21 and is located between the lead 11 and the cathode layer 60. The lead 11 is electrically coupled to the cathode layer 60 through the conductive layer 101. Specifically, with respect to how close the material properties of the lead 11 are to the material properties of the conductive wire 612, the material properties of the conductor layer 101 are closer to the material properties of the lead 11, and the material properties of conductor layer 101 are also closer to the material properties of the conductive wire 612, thereby improving stability of the electrical connection between the conductive wire 612 and the lead 11.

Figure 5:
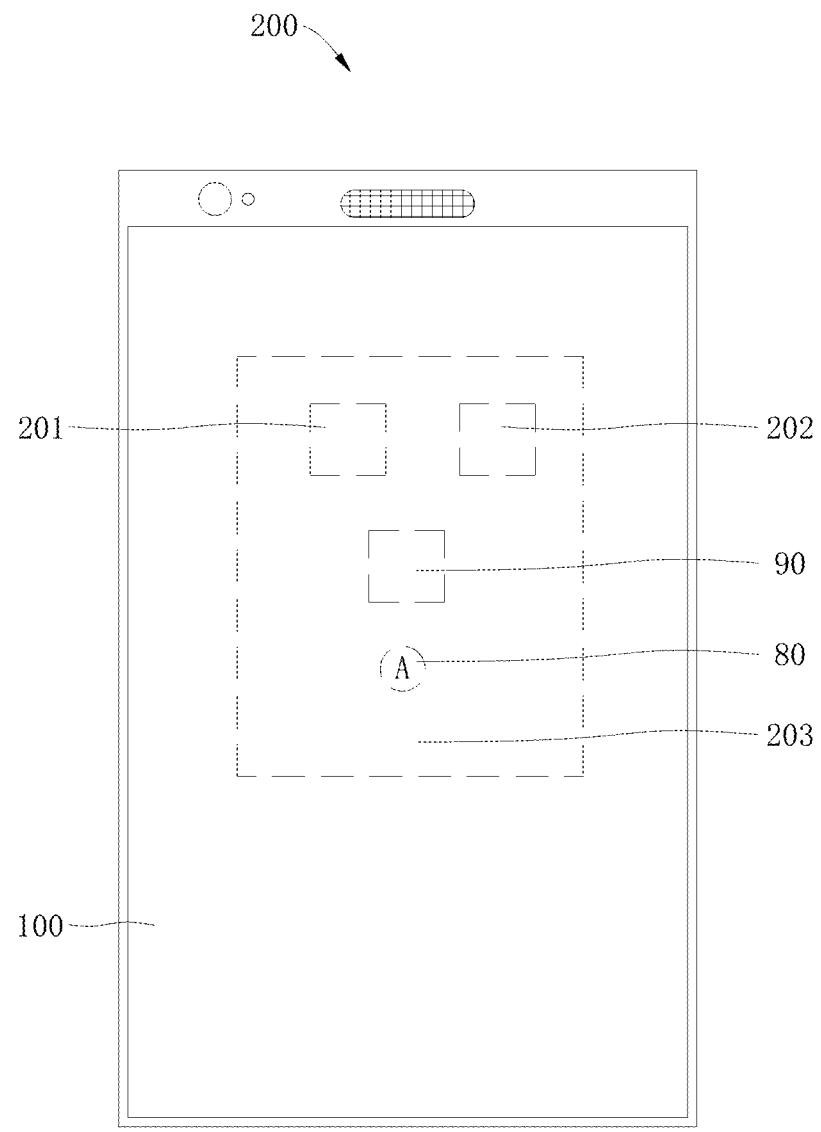
FIG. 5 is a schematic plan view of an electronic device according to some embodiments of the present disclosure.
Figure 6:
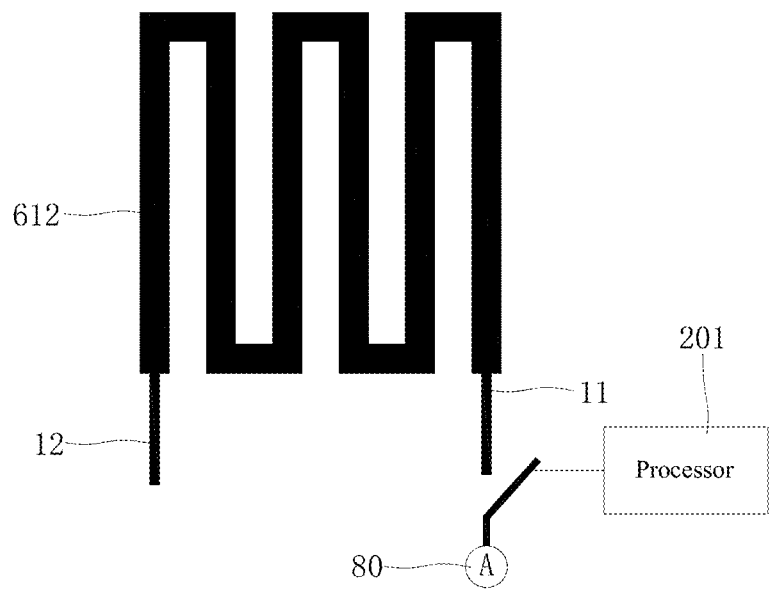
FIG. 6 is a schematic diagram of a principle that the processor controls a connection of an ammeter and a conductive wire according to some embodiments of the present disclosure.

Please referring to FIG. 1, FIG. 5 and FIG. 6, the electronic device 200 of the embodiment of the present disclosure includes the organic light emitting diode display module 100 of any of the above embodiments, an ammeter 80, a processor 201 and a memory unit 202. The ammeter 80 can be electrically coupled to the conductive wire 612 through the lead 11. The ammeter 80 can be used to detect a current flowing through the conductive wire 612. The processor 201 is used to calculate a deformation of each conductive wire 612 according to a length of the conductive wire 612, a Poisson's ratio of the conductive wire 612, a resistivity of the conductive wire 612, a current flowing through the conductive wire 612, and a voltage provided by the power cable 12 to the conductive wire 612. The memory unit 202 stores a plurality of deformation values of the conductive wire 612 and a plurality of curvature radius values corresponding to the plurality of deformation values. The processor 201 determines the curvature radius of the conductive wire 612 according to the deformation of each conductive wire 612 and the plurality of curvature radius values stored in the memory unit 202.

Specifically, the ammeter 80, the processor 201, and the memory unit 202 may all be disposed on a motherboard 203 in the electronic device 200, and the ammeter 80 (or the motherboard 203) may be electrically coupled to the display module 100 through a flexible circuit board. When the display module 100 is used to display an image, the processor 201 controls the lead 11 to disconnect from the ammeter 80 so that the conductive wire 612 can be used as the cathode of the display module 100; when the curvature radius of the display module 100 needs to be detected, the processor 201 controls the lead 11 to be electrically couple to the ammeter 80 so that the conductive wire 612 can be used as a strain resistance.

When the display module 100 is in use, the display module 100 is mainly subjected to a pressing force perpendicular to the display module 100, and the display module 100 is basically not subjected to a pulling force along a periphery of the display module 100. The pressing force perpendicular to the display module 100 will cause the display module 100 to bend and deform. Therefore, the deformation of the conductive wire 612 is basically caused by the pressing force perpendicular to the display module 100, that is, the deformation of the conductive wire 612 is basically formed by the bending of the display module 100 and the conductive wire 612. Therefore, the deformation of the conductive wire 612 corresponds to the curvature radius of the conductive wire 612. According to the formula:

$$\frac{\Delta R}{R} = (1 + 2\mu)e + \frac{\Delta \rho}{\rho} \quad (1)$$

$$K = \frac{\Delta R/R}{\varepsilon} = (1 + 2\mu) + \frac{\Delta \rho/\rho}{\varepsilon} \quad (2)$$

Among them, ΔR in formula (1) and formula (2) is an amount of resistance change of the conductive wire 612 after deformation, R is the resistance of the conductive wire 612 before deformation, µ is the Poisson's ratio of the conductive wire 612, $\varepsilon=\Delta L/L$ ($\Delta L$ is the deformation of the conductive wire 612, L is the length of conductive wire 612 before deformation), $\Delta\rho$ is the amount of resistivity change of conductive wire 612 after deformation, $\rho$ is the resistivity of conductive wire 612 before deformation, K is the strain sensitivity of conductive wire 612. According to formula (1), formula (2), the current flowing through conductive wire 612, and the voltage provided by power cable 12 to conductive wire 612, the deformation of each conductive wire 612 can be calculated, and then the curvature radius of the conductive wire 612 can be determined according to the deformation of each conductive wire 612 and the plurality of curvature radius values stored in the memory unit 202.

The organic light emitting diode display module 100 according to the embodiment of the present disclosure divides the cathode layer 60 into a plurality of conductive wires 612, thereby facilitating obtaining the current flowing through the conductive wire 612 through the ammeter 80. In this way, the processor 201 can calculate the deformation of each conductive line 612, and then determine the curvature radius of the conductive line 612 according to the deformation of each conductive wire 612 and the plurality of curvature radius values stored in the memory unit 202.

Please referring to FIG. 6, in some embodiments, the number of ammeters 80 is multiple, and the number of the conductive wires 612 is multiple. Multiple conductive wires 612 correspond to multiple ammeters 80. Each ammeter 80 is used to detect current flowing through the corresponding conductive wire 612. In this way, multiple ammeters 80 can obtain the current flowing through multiple conductive wires 612.

Figure 7:
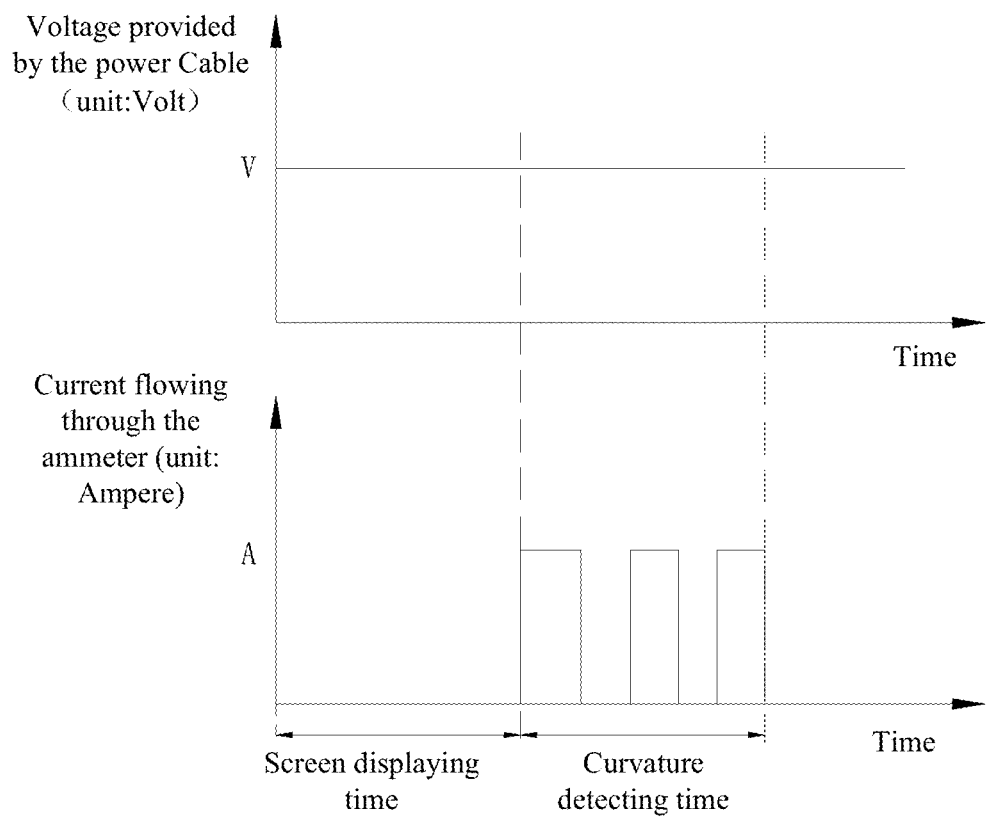
FIG. 7 is a schematic diagram of a working principle of a display module according to some embodiments of the present disclosure.

Please referring to FIGS. 6 and 7, in some embodiments, the display module 100 includes a screen displaying time and a curvature detecting time from a starting of displaying a current frame to a starting of displaying a next frame. The processor 201 is also used for performing as follows.

During the screen displaying time, the processor 201 is used for controlling the ammeter 80 to disconnect from the lead 11, and applying a display driving signal to conductive wire 612 to drive display module 100 to display a image screen.

During the curvature detecting time, the processor 201 is used for controlling the ammeter 80 to be conductive to with the lead 11 so that the ammeter 80 detects the current of the conductive wire 612.

Specifically, the curvature detecting time is less than or equal to the time that the user cannot distinguish (for example, 30 milliseconds). Due to the afterimage phenomenon, after the image seen by the human eye disappears, the human eye can continue to retain the image for about 0.1-0.4 seconds, so the user can always "see" the image displayed by the display module 100. The screen displaying time of this embodiment is equal to the curvature detecting time. In other embodiments, the screen displaying time is less than the curvature detecting time; or, the screen displaying time is greater than the curvature detecting time.

The conductive wire 612 of this embodiment can be used as an electrode of the display module 100 during the screen displaying time, and the conductive wire 612 can be used as a strain resistance during the curvature detecting time. Therefore, the display module 100 of this embodiment can detect the curvature radius of the display module 100 without setting a strain resistance.

Figure 8:
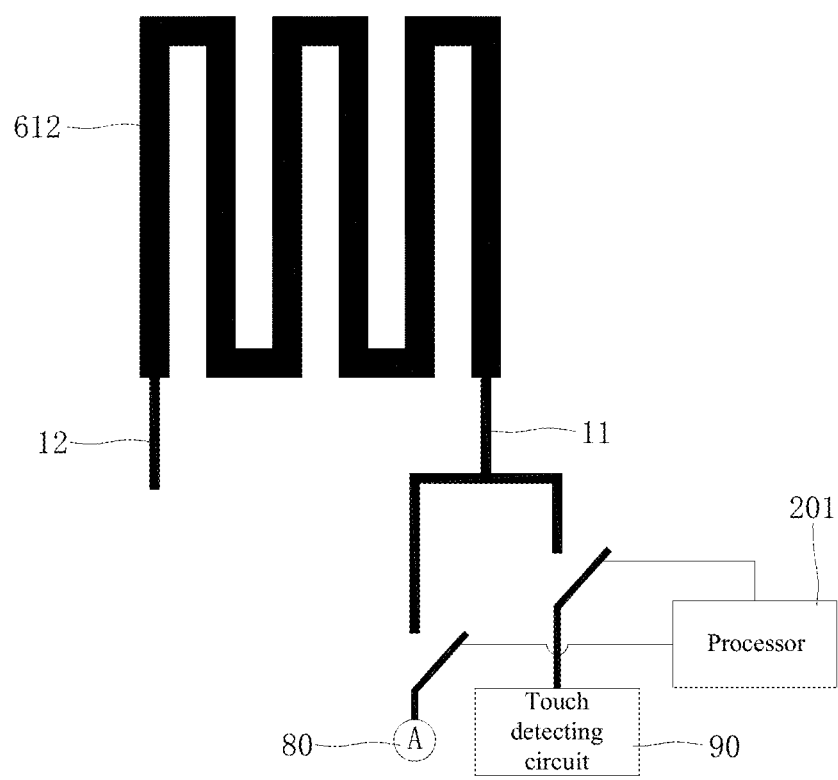
FIG. 8 is a schematic diagram illustrating that the processor controls the ammeter or the touch detecting circuit to be coupled to conductive wires respectively according to some embodiments of the present disclosure.
Figure 9:
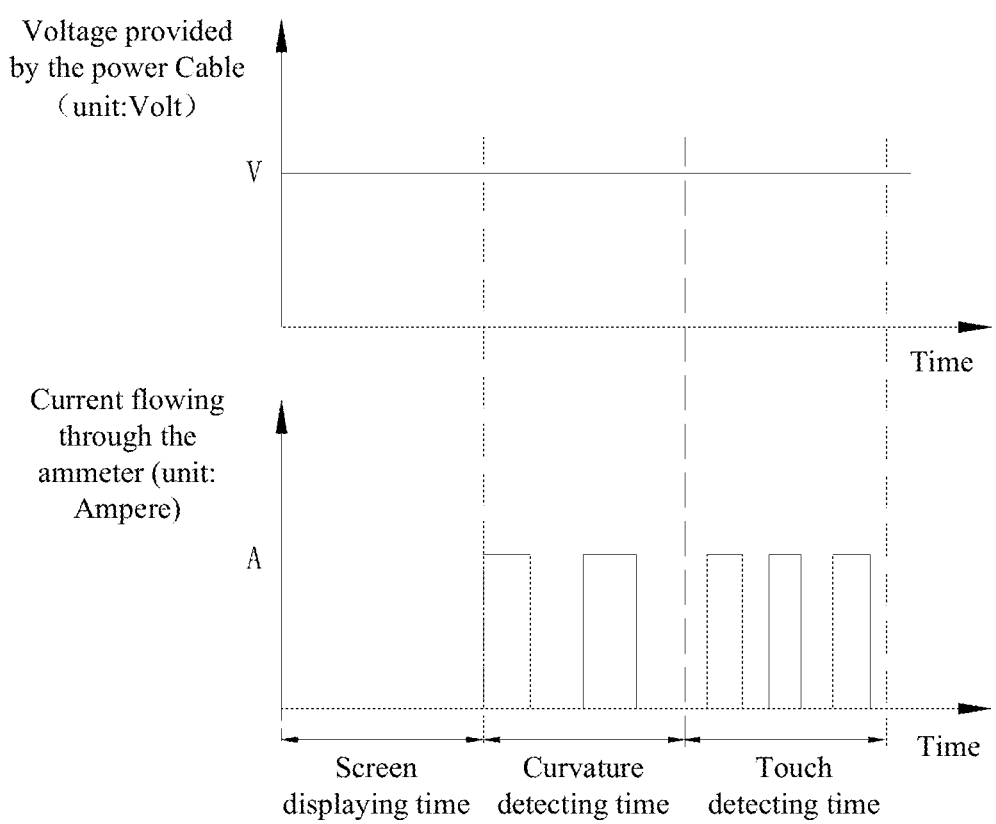
FIG. 9 is a schematic diagram of a working principle of a display module according to some embodiments of the present disclosure.

Please referring to FIGS. 8 and 9, in some embodiments, the display module 100 further includes a touch detecting circuit 90. The touch detecting circuit 90 can be coupled to the conductive wire 612 through the lead 11 and used to detect a touch signal corresponding to a user's touch operation. The time of the display module 100 starting from the starting of displaying the current frame and the starting of displaying the next frame includes the screen displaying time, the curvature detecting time, and a touch detecting time. The processor 201 is also used for performing as follows.

During the screen displaying time, the processor 201 is also used for controlling the ammeter 80 to disconnect from the lead 11, controlling the touch detecting circuit 90 to disconnect from the lead 11, and applying a display driving signal to the conductive wire 612 to drive the display module 100 to display an image screen.

During the curvature detecting time, the processor 201 is also used for controlling the ammeter 80 to be conductive to the lead 11 so that ammeter 80 detects a current of the conductive wire 612.

During the touch detecting time, the processor 201 is also used for controlling the touch detecting circuit 90 to be conductive to the lead 11 so that the touch detecting circuit 90 detects a touch signal generated by the conductive wire 612.

Specifically, the sum of the curvature detecting time and the touch detecting time is less than or equal to the time that the user cannot distinguish (for example, 30 milliseconds). Due to the afterimage phenomenon, after the image seen by the human eye disappears, the human eye can continue to retain the image for about 0.1-0.4 seconds, so the user can always "see" the image displayed by the display module 100. The screen displaying time, the curvature detecting time, and the touch detecting time of this embodiment are all equal. In other embodiments, the screen displaying time is less than the curvature detecting time and the touch detecting time; or, the screen displaying time is greater than the curvature detecting time and the touch detecting time.

The conductive wire 612 of this embodiment can be used as an electrode of the display module 100 during the screen displaying time, the conductive wire 612 can be used as a strain resistance during the curvature detecting time, and the conductive wire 612 can be used as a touch electrode during the touch detecting time, so the display module 100 of the embodiment can detect the curvature radius of the display module 100 without setting a strain resistance; at the same time, the display module 100 can detect a touch position of the user touching the display module 100 without setting a touch electrode.

In some embodiments, the time between the display module 100 starting to display the current frame and the next frame is less than or equal to 20 milliseconds.

Since the time between the display module 100 starting to display the current frame and the next frame is less than or equal to 20 milliseconds, the curvature detecting time is less than 20 milliseconds, so the curvature detecting time is less than or equal to the time that the user cannot distinguish (for example, 30 Milliseconds), due to the afterimage phenomenon, after the image seen by the human eye disappears, the human eye can continue to retain the image for about 0.1-0.4 seconds, so the user can always "see" the image displayed by the display module 100; or, the sum of the curvature detecting time and the touch detecting time is less than 20 milliseconds, so the sum of the curvature detecting time and the touch detecting time is less than or equal to the time that the user cannot distinguish (for example, 30 milliseconds). After the screen disappears, the human eye can still keep the image for about 0.1-0.4 seconds, so the user can always "see" the image displayed by the display module 100.

Figure 10:
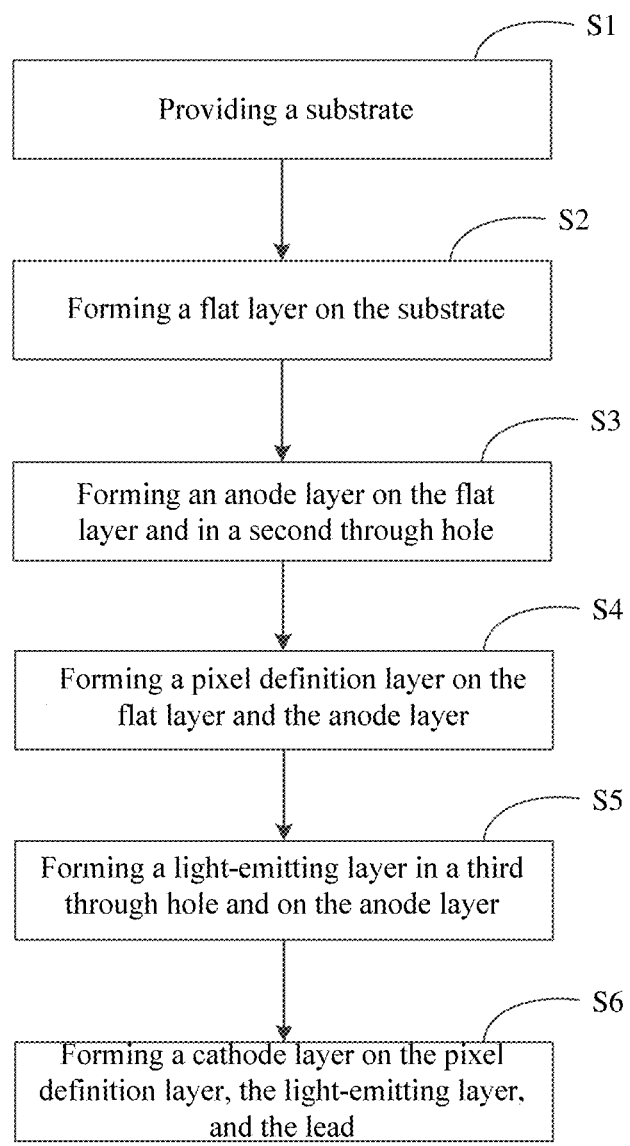
FIG. 10 is a schematic flowchart of a method for manufacturing the display module according to some embodiments of the present disclosure.
Figure 11:
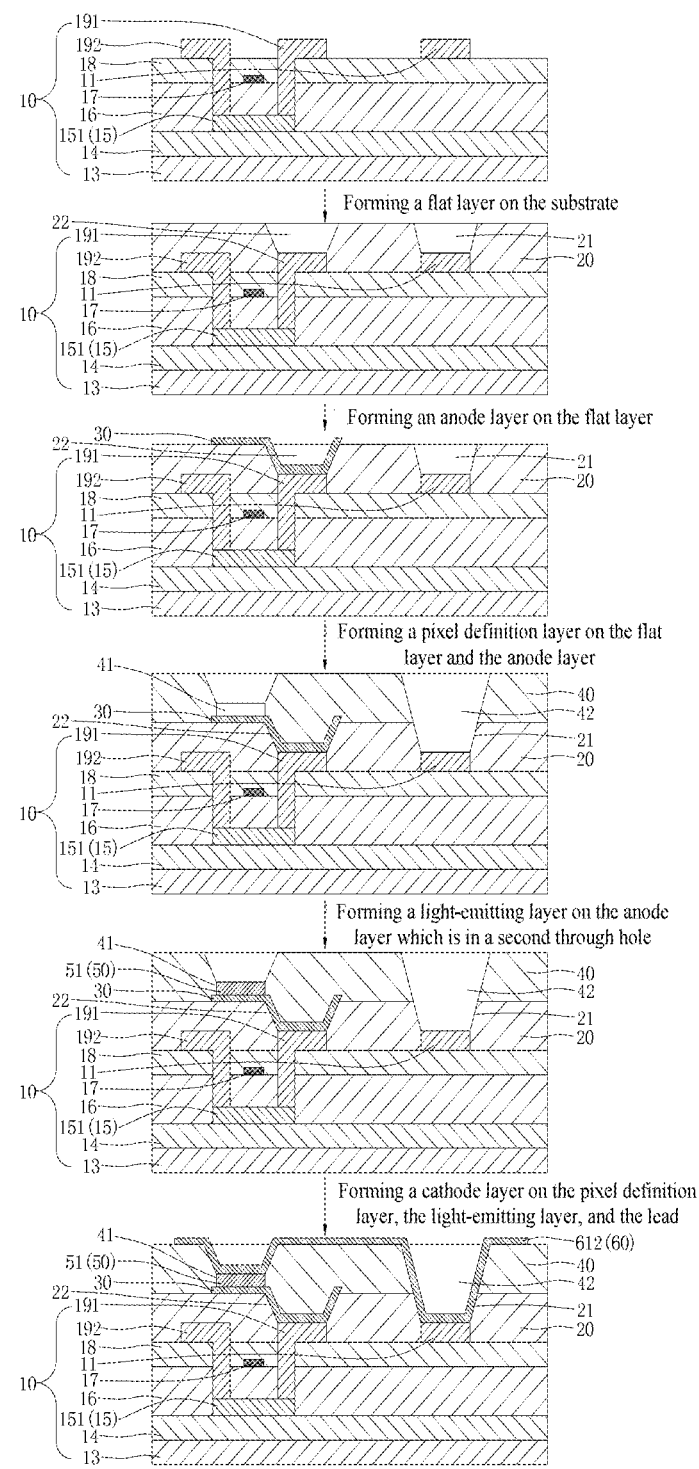
FIG. 11 is a schematic flowchart of the principle of a method for manufacturing the display module according to some embodiments of the present disclosure.

Please referring to FIG. 1, FIG. 10 and FIG. 11, the manufacturing method of the organic light emitting diode display module 100 according to the embodiment of the present disclosure includes following steps.

S1, a substrate 10 is provided, and a lead 11 and a power cable 12 are formed on the substrate 10.

S2, a flat layer 20 is formed on the substrate 10, and a first through hole 21 and a second through hole 22 are defined on the flat layer 20, and a part of the lead 11 corresponds to a position of the first through hole 21.

S3, an anode layer 30 is formed on the flat layer 20 and within the second through hole 22.

S4, a pixel definition layer 40 is formed on the flat layer 20 and the anode layer 30, and a third through hole 41 and a fourth through hole 42 are defined on the pixel definition layer 40. A part of the anode layer 30 corresponds to a position of third through hole 41, and the fourth through hole 42 is interconnected with the first through hole 21.

S5, a light-emitting layer 50 is formed within the third through hole 41 and on the anode layer 30.

S6, a cathode layer 60 is formed on the pixel definition layer 40, the light-emitting layer 50, and the lead 11; the cathode layer 60 includes a plurality of wire blocks 61 arranged at intervals, each wire block 61 includes a bent conductive wire 612, one end of each conductive wire 612 is coupled to the lead 11, and the other end of each conductive wire 612 is coupled to the power cable 12.

The organic light emitting diode display module 100 manufactured by a method for manufacturing the organic light emitting diode display module 100 according to the embodiment of the present disclosure can divide the cathode layer 60 into a plurality of conductive wires 612, so that a curvature radius of a position of the display module 100 can be determined according to the curvature radius of each conductive wire 612, so that the display module 100 can perform display compensation on the display module 100 according to the curvature radius of each conductive wire 612.

Figure 12:
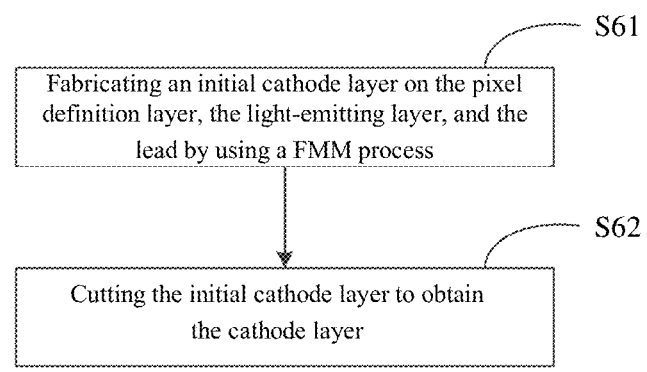
FIG. 12 is a schematic flowchart of a method for manufacturing the display module according to some embodiments of the present disclosure.
Figure 14:
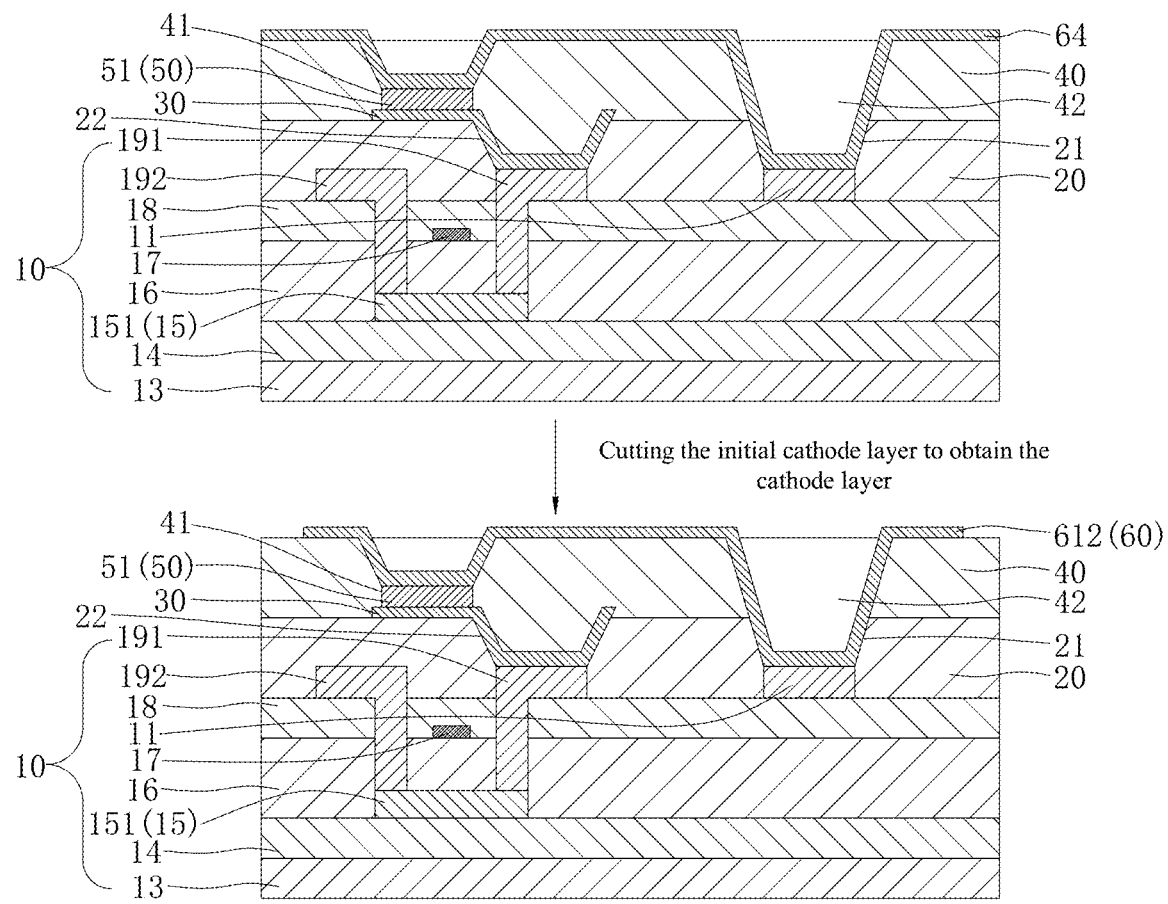
FIG. 14 is a schematic diagram of a method of manufacturing the display module according to some embodiments of the present disclosure.

Referring to FIG. 12 and FIG. 14, in some embodiments, the step of the cathode layer 60 is formed on the pixel definition layer 40, the light-emitting layer 50, and the lead 11 (step S6) includes following steps.

S61, an initial cathode layer 64 is fabricated on the pixel definition layer 40, the light-emitting layer 50, and the lead 11 by using a fine metal mask (FMM) process;

S62, the initial cathode layer 64 is cut to obtain the cathode layer 60.

Specifically, the initial cathode layer 64 can be formed by laser cutting. The cathode layer 60 includes a plurality of wire blocks 61 arranged at intervals, each wire block 61 includes a bent conductive wire 612, and one end of each conductive wire 612 is coupled to the lead 11, the other end of each conductive wire 612 is coupled to the power cable 12. Since the FMM process is an existing manufacturing process, the equipment required for manufacturing the initial cathode layer 64 is easily available, thereby reducing the manufacturing cost of the cathode layer 60.

Figure 13:
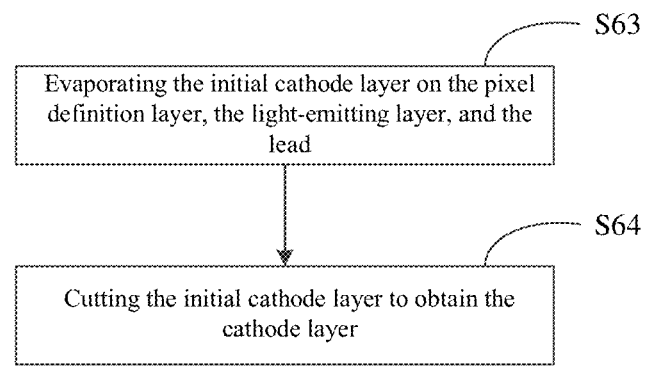
FIG. 13 is a schematic flowchart of a method for manufacturing the display module according to some embodiments of the present disclosure.

Please referring to FIGS. 13 and 14, in some embodiments, the step of the cathode layer 60 is formed on the pixel definition layer 40, the light-emitting layer 50, and the lead 11 (step S6) includes following steps.

S63, the initial cathode layer 64 is evaporated on the pixel definition layer 40, the light-emitting layer 50, and the lead 11;

S64, the initial cathode layer 64 is cut to obtain the cathode layer 60.

Specifically, the initial cathode layer 64 can be formed by laser cutting. The cathode layer 60 includes a plurality of wire blocks 61 arranged at intervals, each wire block 61 includes a bent conductive wire 612, and one end of each conductive wire 612 is coupled to the lead 11, and the other end of each conductive wire 612 is coupled to the power cable 12. Since vapor deposition is an existing manufacturing process, the equipment required for manufacturing the initial cathode layer 64 is easily available, thereby reducing the manufacturing cost of the cathode layer 60.

Figure 15:
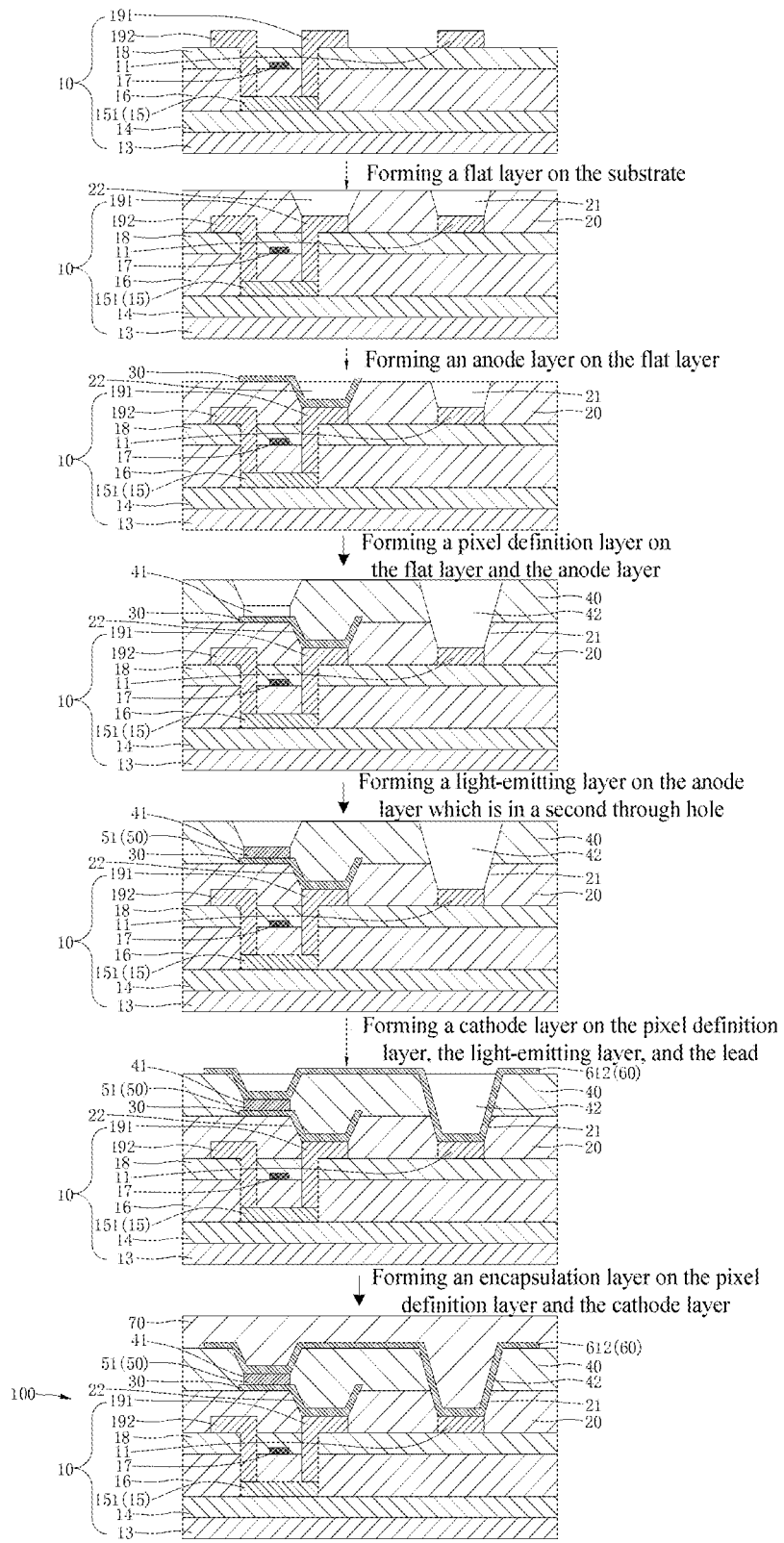
FIG. 15 is a schematic diagram of the principle of a method for manufacturing the display module according to some embodiments of the present disclosure.

Please referring to FIG. 15, in some embodiments, the manufacturing method of the organic light emitting diode display module 100 further includes following steps.

A thin film encapsulation (TFE) is used to form a packaging layer 70 on the cathode layer 60 and the pixel definition layer 40 to obtain the display module 100.

The encapsulation layer 70 is used to isolate the cathode layer 60 from contact with water vapor and oxygen to avoid chemical reaction between the cathode layer 60 and water vapor and oxygen, thereby increasing a service life of the display module 100.

In the description of this specification, reference is made to the terms "some embodiments", "one embodiment", "many embodiments", "schematic embodiments", "examples", "specific examples", or "some examples", etc. The description means that the specific features, structures, materials, or characteristics described in connection with the embodiments or examples are included in at least one embodiment or example of the present disclosure. In this specification, the schematic expression of the above-mentioned terms does not necessarily refer to the same embodiment or example. Moreover, the specific features, structures, materials, or characteristics described may be combined in any suitable manner in any one or more embodiments or examples.

In addition, the terms "first" and "second" are used for description purposes only, and cannot be understood as indicating or implying relative importance or implicitly indicating the number of technical features indicated. Thus, the features defined as "first" and "second" may include at least one of the features explicitly or implicitly. In the description of the present disclosure, the meaning of "plurality" is at least two, for example, two, three, etc., unless specifically defined otherwise.

Although the embodiments of the present disclosure have been shown and described above, it is understood that the above embodiments are exemplary and cannot be construed as limiting the present disclosure. Those of ordinary skill in the art can make changes, modifications, substitutions, and variations to the above-described embodiments within the scope of the present disclosure, and the scope of the present disclosure is defined by the claims and their equivalents.

What is claimed is:

1. An organic light emitting diode display module, wherein, the display module comprises:
   a substrate with a lead and a power cable formed on the substrate;
   a flat layer formed on the substrate, the flat layer defining a first through hole and a second through hole; and a part of the lead corresponding to a position of the first through hole;
   an anode layer formed on the flat layer and within the second through hole;
   a pixel definition layer formed on the flat layer and the anode layer; the pixel definition layer defining a third through hole and a fourth through hole; a part of the anode layer corresponds to a position of the third through hole; the fourth through hole interconnecting with the first through hole;

a light-emitting layer formed within the third through hole and on the anode layer;

a cathode layer formed on the pixel definition layer, the light-emitting layer, and the lead;

the cathode layer comprising a plurality of wire blocks arranged at intervals; and each wire block comprising a bent conductive wire; one end of each conductive wire being coupled to the lead, and the other end of each conductive wire being coupled to the power cable.

2. The display module according to claim 1, wherein the substrate comprises:

a substrate layer;

a buffer layer forming on the substrate layer;

a semiconductor layer formed on the buffer layer;

a first insulating layer formed on the buffer layer and the semiconductor layer;

a gate layer formed on the first insulating layer;

a second insulating layer formed on the gate layer and the first insulating layer;

a drain and a source electrically coupled to the semiconductor layer; the lead, the drain and the source are formed on the second insulating layer; and the drain corresponds to a position of the second through hole.

3. The display module according to claim 1, wherein the substrate comprises:

a substrate layer;

a buffer layer forming on the substrate layer;

a semiconductor layer formed on the buffer layer;

a first insulating layer formed on the buffer layer and the semiconductor layer;

a gate layer and a lead formed on the first insulating layer;

a second insulating layer formed on the gate layer and the lead; the second insulating layer defining a fifth through hole corresponding to the first through hole; and a part of the lead corresponding to a position of the fifth through hole;

a drain and a source electrically coupled to the semiconductor layer; the drain and the source being formed on the second insulating layer.

4. The display module according to claim 1, wherein the plurality of the wire blocks are distributed in an array on the pixel definition layer, the light-emitting layer, and the lead.

5. The display module according to claim 1, wherein materials of the conductive wire comprises any one of magnesium, magnesium-silver alloy, and magnesium-ytterbium alloy.

6. A method for manufacturing an organic light emitting diode display module, wherein the method comprises following steps:

providing a substrate with a lead and a power cable formed on the substrate;

forming a flat layer on the substrate, the flat layer defining a first through hole and a second through hole, and a part of the lead corresponding to a position of the first through hole;

forming an anode layer on the flat layer and within the second through hole;

forming a pixel definition layer on the flat layer and the anode layer, the pixel definition layer defining a third through hole and a fourth through hole, and a part of the anode layer corresponding to a position of the third through hole, the fourth through hole interconnecting with the first through hole;

forming a light-emitting layer within the third through hole and on the anode layer;

forming a cathode layer on the pixel definition layer, the light-emitting layer, and the lead; the cathode layer comprising a plurality of wire blocks arranged at intervals; and each wire blocks comprising a bent conductive wire; one end of each conductive wire is coupled to the lead, and the other end of each conductive wire is coupled to the power cable.

7. The method for manufacturing the display module according to claim 6, wherein the step of forming the cathode layer on the pixel definition layer, the light-emitting layer, and the lead comprises:

fabricating an initial cathode layer on the pixel definition layer, the light-emitting layer, and the lead by using a fine metal mask process;

cutting the initial cathode layer to obtain the cathode layer.

8. The method for manufacturing the display module according to claim 6, wherein the step of forming the cathode layer on the pixel definition layer, the light-emitting layer, and the lead comprises:

evaporating an initial cathode layer on the pixel definition layer, the light-emitting layer, and the lead;

cutting the initial cathode layer to obtain the cathode layer.

9. The method for manufacturing the display module according to claim 6, wherein the manufacturing method further comprises:

forming a packaging layer on the cathode layer by using a thin film packaging technology to obtain the display module.

* * * * *